United States Patent
Chang et al.

(10) Patent No.: US 7,710,005 B2
(45) Date of Patent: *May 4, 2010

(54) OPTICAL FILTER OF PLASMA DISPLAY PANEL AND FABRICATION METHOD THEREOF

(75) Inventors: Myeong Soo Chang, Gyeonggi-Do (KR); Hong Rae Cha, Seoul (KR); Byung Gil Ryu, Seoul (KR); Kyung Ku Kim, Seoul (KR); Young Sung Kim, Gyeonggi-Do (KR)

(73) Assignee: LG Electronics Inc., Seoul (KR)

( * ) Notice: Subject to any disclaimer, the term of this patent is extended or adjusted under 35 U.S.C. 154(b) by 491 days.

This patent is subject to a terminal disclaimer.

(21) Appl. No.: 11/650,414

(22) Filed: Jan. 8, 2007

(65) Prior Publication Data

US 2007/0121197 A1 May 31, 2007

Related U.S. Application Data

(63) Continuation of application No. 10/852,432, filed on May 25, 2004, now Pat. No. 7,511,407.

(30) Foreign Application Priority Data

May 28, 2003 (KR) .............................. 34111/2003

(51) Int. Cl.
- *H01J 5/16* (2006.01)
- *H01K 1/26* (2006.01)
- *H01J 17/49* (2006.01)

(52) U.S. Cl. ................. 313/112; 313/110; 313/582; 313/634; 313/635; 313/313

(58) Field of Classification Search ............. None
See application file for complete search history.

(56) References Cited

U.S. PATENT DOCUMENTS

| 6,150,754 A | 11/2000 | Yoshikawa et al. | |
|---|---|---|---|
| 6,229,085 B1 | 5/2001 | Gotoh et al. | |
| 6,621,003 B2 * | 9/2003 | Yoshida et al. | 428/432 |
| 2002/0050783 A1 | 5/2002 | Kubota et al. | |
| 2003/0007341 A1 | 1/2003 | Shimamura et al. | |
| 2003/0094296 A1 | 5/2003 | Kojima et al. | |

FOREIGN PATENT DOCUMENTS

| EP | 0 908 920 | 4/1999 |
|---|---|---|
| EP | 1134072 A2 | 9/2001 |

(Continued)

OTHER PUBLICATIONS

Chinese Office Action dated Aug. 15, 2008 with English Translation.

(Continued)

*Primary Examiner*—Nimeshkumar D Patel
*Assistant Examiner*—Natalie K Walford
(74) *Attorney, Agent, or Firm*—Ked & Associates LLP (57) ABSTRACT

An optical filter of a plasma display panel (PDP) and its fabrication method are disclosed. The optical filter includes an electromagnetic wave shield layer having a bias angle formed by cutting a mesh film along a predetermined direction.

15 Claims, 7 Drawing Sheets

FOREIGN PATENT DOCUMENTS

| | | |
|---|---|---|
| EP | 1195991 A1 | 4/2002 |
| EP | 1253816 A2 | 10/2002 |
| JP | 11338383 | 12/1999 |
| JP | 11340680 A | 12/1999 |
| JP | 2001-022283 | 1/2001 |
| JP | 2001-141923 | 5/2001 |
| JP | 2002-319351 | 10/2002 |
| JP | 2002326305 A | 11/2002 |
| JP | 2002-347166 | 12/2002 |
| JP | 2003023290 A | 1/2003 |
| JP | 2003-086991 | 3/2003 |

OTHER PUBLICATIONS

European Search Report dated Feb. 23, 2009.
Japanese Office Action dated Jun. 19, 2009.
Korean Office Action dated Jul. 20, 2009.

* cited by examiner

OPTICAL FILTER OF PLASMA DISPLAY PANEL AND FABRICATION METHOD THEREOF

This application is a Continuation of U.S. application Ser. No. 10/852,432 filed May 25, 2004 now U.S. Pat. No. 7,511,407. The disclosure of the previous application is incorporated by reference herein.

BACKGROUND OF THE INVENTION

1. Field of the Invention

The present invention relates to a PDP (Plasma Display Panel) and, more particularly, to an optical filter of the PDP and its fabrication method.

2. Description of the Background Art

Lately, the PDP, a TFT-LCD (Thin Layer Transistor-Liquid Crystal Display), an organic EL (ElectroLuminescence), an FED (Field Emission Display) or the like has been developed as a next-generation digital multimedia display device. Among them, the PDP receives much attention in markets with its merits compared to other display devices.

The PDP is a display device using radiation phenomenon generated when 147 nm ultraviolet generated as He+Xe or Ne+Xe gas is discharged excites R, G and B fluorescent materials in discharge cells formed by barrier ribs. The PDP is most expected display device for a large screen of greater than 40 inches thanks to its advantages of facilitation of fabrication according to a simple structure, high luminance, high efficiency, a memory function, high nonlinearity and a wide angular field of greater than 160°.

A discharge cell of a three-electrode AC surface discharge type PDP having such characteristics will now be described.

Figure 1:
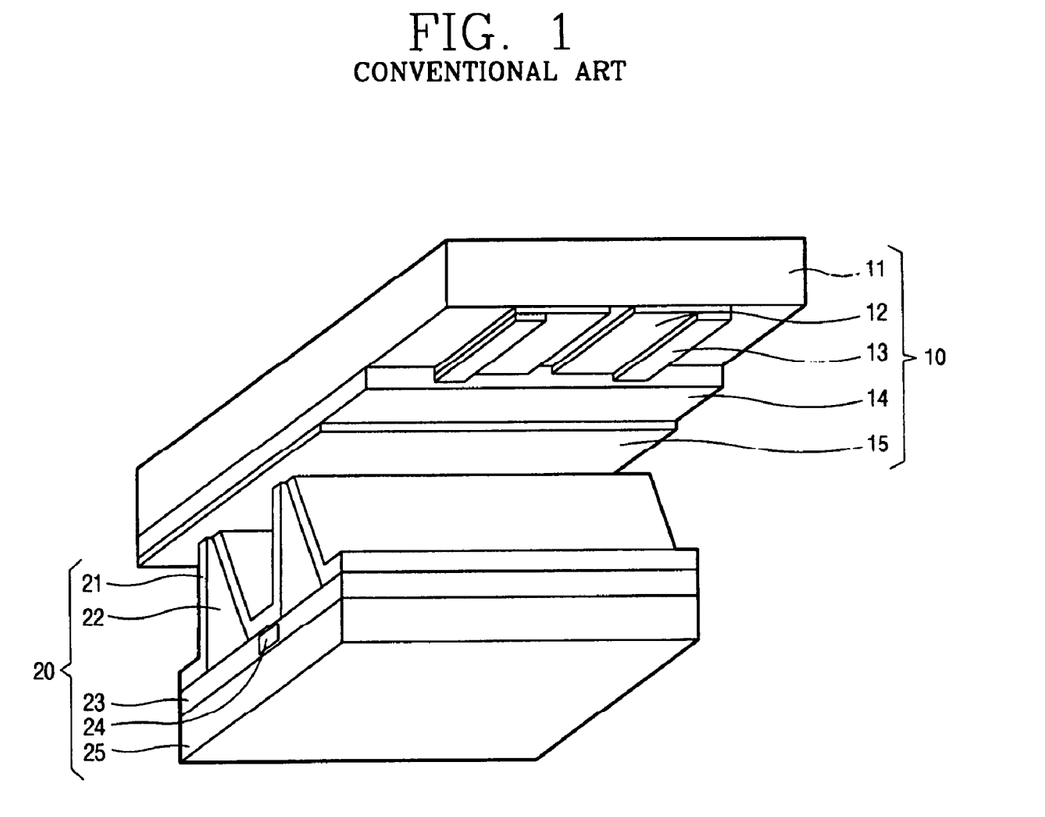
FIG. 1 is a perspective view showing a discharge cell structure of a three-electrode AC surface discharge type PDP in accordance with a conventional art.

FIG. 1 is a perspective view showing a discharge cell of a general three-electrode AC surface discharge type PDP.

As shown in FIG. 1, a discharge cell of the PDP is formed by coupling one front plate 10 and a back plate 20 and injecting a discharge gas therebetween.

The front plate 10 includes: an upper glass substrate 11; a transparent electrode 12 and a bus electrode 13 formed on the upper glass substrate 11; an upper dielectric layer 14 formed at the entire surface of the upper glass substrate 11 including the transparent electrode 12 and the bus electrode 13; and a protection layer 15 formed at the entire surface of the upper dielectric layer 14 to protect the upper dielectric layer 14 against plasma discharge.

The back plate 20 includes: a lower glass substrate 25; an address electrode 14 formed on the lower glass substrate 25; a lower dielectric layer 23 formed at the entire surface of the lower glass substrate 25 including the address electrode 24; a barrier rib 22 formed on the lower dielectric layer 23 to form a discharge cell; and a phosphor 21 formed at the entire surface of the lower dielectric layer 23 and the barrier rib 22.

An optical filter is installed at the entire surface of the thusly constructed PDP in order to prevent reflection of an external light, shield near infrared ray, shield electromagnetic wave and enhance a color purity.

A method for fabricating an electromagnetic wave shield layer for shielding electromagnetic wave discharged from the PDP, which constitutes the optical filter of the PDP, in accordance with a conventional art will now be described with reference to FIG. 2.

Figure 2:
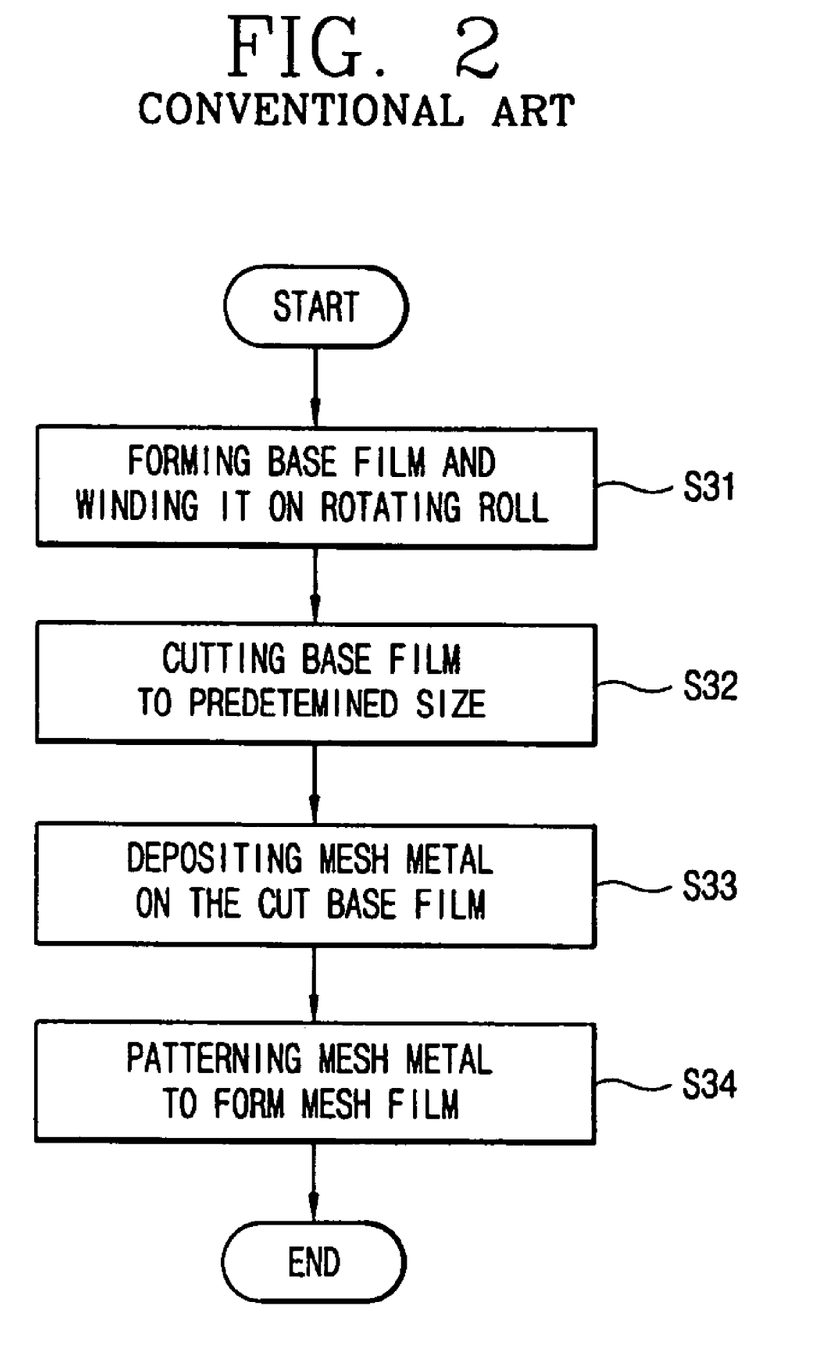
FIG. 2 is a flow chart of a method for fabricating an electromagnetic wave shield layer constituting an optical filter of the PDP in accordance with the conventional art.

FIG. 2 is a flow chart of a method for fabricating an electromagnetic wave shield layer of the optical filter of the PDP in accordance with the conventional art.

As shown in FIG. 2, the conventional method for fabricating an electromagnetic wave shield layer of the optical filter of the PDP includes: forming a base film and winding the base film on a rotating roll (step S31); cutting the wound base film into a predetermined size (step S32); depositing a mesh metal on the cut base film (step S33); and patterning the deposited mesh metal to form a mesh film (step S34).

The conventional method for fabricating an electromagnetic wave shield layer of the optical filter of the PDP will be described in detail as follows.

First, the base film is formed and then wound on the rotating roll (step S31). The base film is formed as a metal foil is laminated on polyethylene terephthalate (PET). The base film wound on the rotating roll is cut to a predetermined size (step S32).

Thereafter, the mesh metal is deposited on the base film which has been cut to the predetermined size (step S33), and then patterned through a photolithography process including an exposing and developing process using a photomask and an etching process (step S34). As for the photomask, a transmission part and a blocking part of the photomask differ in its alignment form according to various resolutions, so a bias angle ($\theta$) is controlled according to a type of the photomask.

As the mesh film having a conductive mesh is formed on the base film through the patterning process, the optical filter of the PDP adopting the electromagnetic wave shield layer 300 in accordance with the conventional art is formed.

As mentioned above, the conventional method for fabricating the electromagnetic wave shield layer has the following problem.

That is, whenever the mesh metal is deposited on the base film and patterned in order to control the predetermined bias angle according to various resolutions of the PDP, photomasks corresponding to the various resolutions of the PDP are required.

SUMMARY OF THE INVENTION

Therefore, an object of the present invention is to provide an optical filter of a PDP and its fabrication method capable of forming an electromagnetic wave shield layer having a predetermined bias angle according to various resolutions of a PDP with the same photomask by controlling a cut direction of a mesh film having a conductive mesh according to resolution of the PDP.

To achieve these and other advantages and in accordance with the purpose of the present invention, as embodied and broadly described herein, there is provided an optical filter of a PDP includes an electromagnetic wave shield layer having a bias angle formed by cutting a mesh film along a predetermined direction.

To achieve the above object, there is also provided a method for fabricating an optical filter of a PDP including: forming an electromagnetic wave shield layer having a bias angle formed by cutting a mesh film along a predetermined direction.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

An optical filter of a PDP and its fabrication method capable of forming an electromagnetic wave shield layer having a predetermined bias angle according to various resolutions of a PDP with the same photomask by controlling a cut direction of a mesh film having a conductive mesh according to resolution of the PDP, in accordance with a preferred embodiment of the present invention will now be described with reference to the accompanying drawings.

Figure 3:
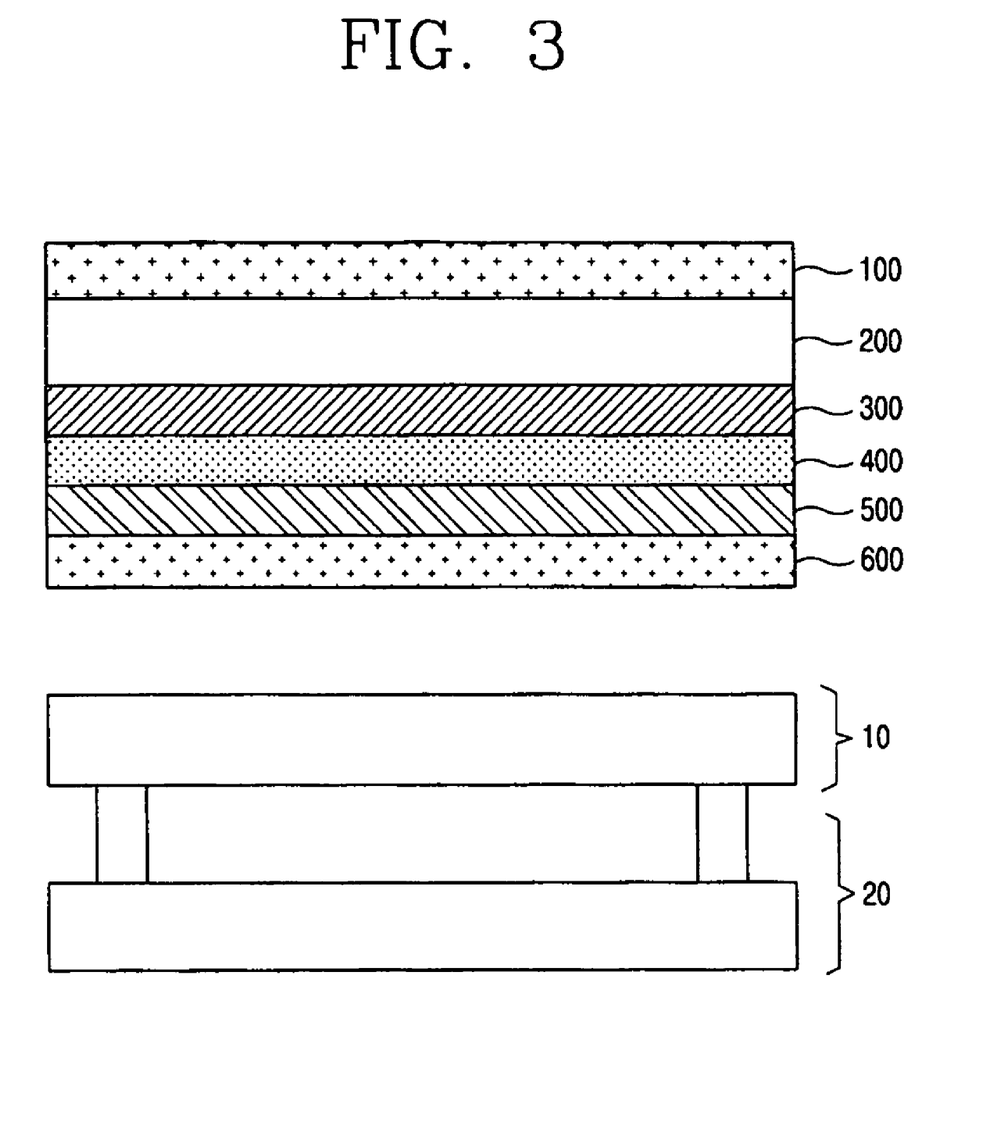
FIG. 3 is a sectional view showing a structure of an optical filter of a PDP employing an electromagnetic wave shield layer in accordance with a first embodiment of the present invention.

FIG. 3 is a sectional view showing a structure of an optical filter of a PDP employing an electromagnetic wave shield layer in accordance with a first embodiment of the present invention.

As shown in FIG. 3, an optical filter of a PDP in accordance with the first embodiment of the present invention includes: a glass substrate 200; a first anti-reflection layer 100 attached at an upper surface of the glass substrate 200 and preventing reflection of an external light; an electromagnetic wave shield layer 300 attached at a lower surface of the glass substrate 200 and shielding discharge of electromagnetic wave; a near infrared shield layer 400 attached at a lower surface of the electromagnetic wave shield layer 300 and shielding discharge of near infrared ray; a color compensation layer 500 attached at a lower surface of the near infrared shield layer 400 and controlling a color purity; and a second anti-reflection layer 600 attached at a lower surface of the color compensation layer 500 and preventing reflection of an external light.

A method for fabricating the optical filter of a PDP employing the electromagnetic wave shield layer in accordance with the first embodiment of the present invention will now be described with reference to FIG. 4.

Figure 4:
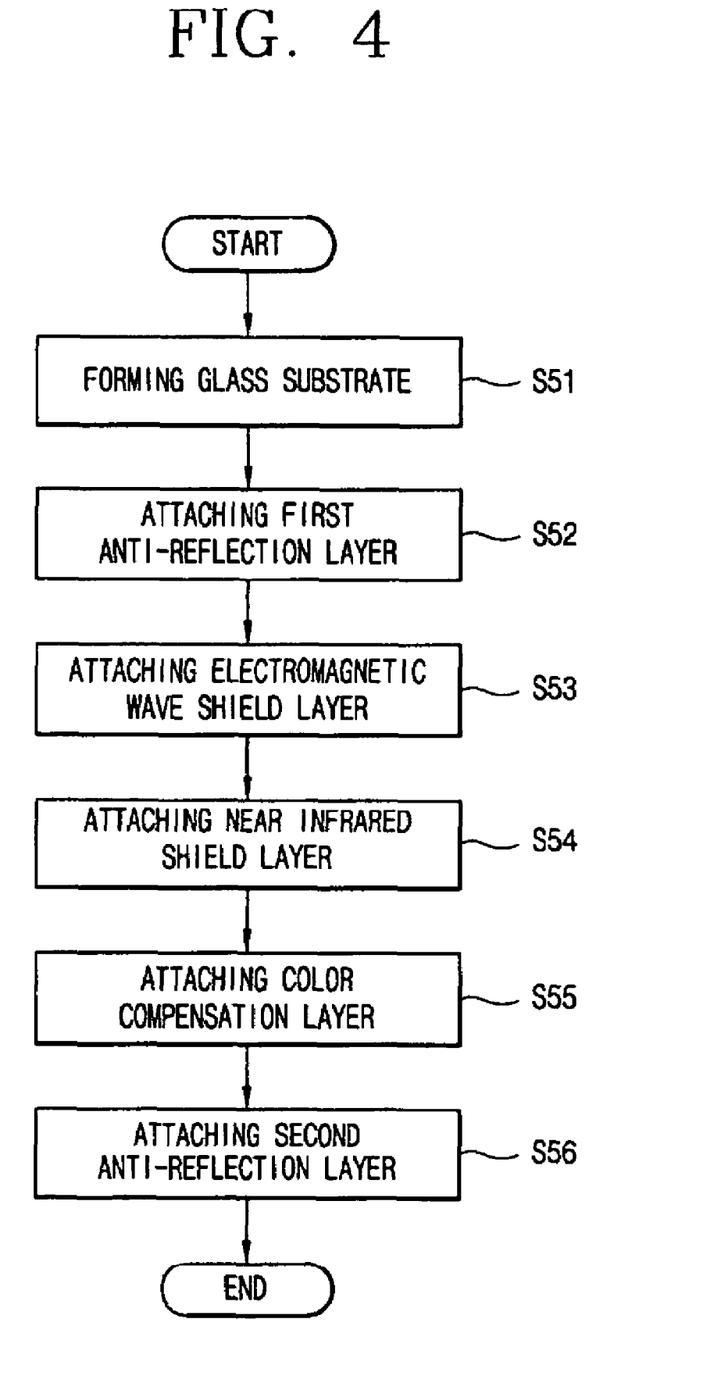
FIG. 4 is a flow chart of a method for fabricating the optical filter of a PDP employing an electromagnetic wave shield layer in accordance with the first embodiment of the present invention.

FIG. 4 is a flow chart of a method for fabricating the optical filter of a PDP employing an electromagnetic wave shield layer in accordance with the first embodiment of the present invention.

As shown in FIG. 4, the method for fabricating the optical filter of a PDP employing an electromagnetic wave shield layer in accordance with the first embodiment of the present invention, includes: forming the glass substrate 200 (step S51); attaching the first anti-reflection layer 100 for preventing reflection of an external light at the upper surface of the glass substrate 200 (step S52); attaching the electromagnetic wave shield layer 300 for shielding discharge of electromagnetic wave at the lower surface of the glass substrate 200 (step S53); attaching the near infrared shield layer 400 for shielding discharge of near infrared ray at the lower surface of the electromagnetic wave shield layer 300 (step S54); attaching the color compensation layer 500 for controlling a color purity at the lower surface of the near infrared shield layer 400 (step S55); and attaching the second anti-reflection layer 600 for preventing reflection of an external light at the lower surface of the color compensation layer 500 (step S56).

The method for fabricating the optical filter of a PDP employing the electromagnetic wave shield layer in accordance with the first embodiment of the present invention will now be described in detail.

First, the glass substrate 200 is formed with tempered glass to support the optical filter and protect the optical filter and the PDP against damage due to an external impact (step S51).

The first anti-reflection layer 100 is attached at the upper surface of the glass substrate 200 to prevent reflection of light made incident from outside, thereby improving a contrast of the PDP (step S52).

The electromagnetic wave shield layer 300 is attached at the lower surface of the glass substrate 200 to absorb electromagnetic wave generated from the PDP to prevent its discharge externally (step S53).

The electromagnetic wave shield layer 300 having such characteristics will be described with reference to FIGS. 5 and 6 as follows.

Figure 5:
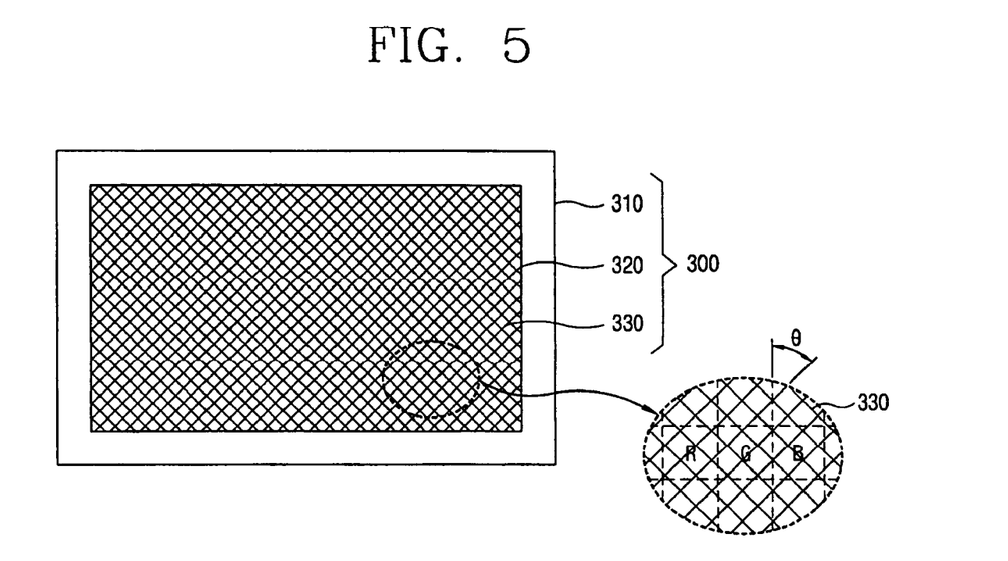
FIG. 5 illustrates a structure of the electromagnetic wave filter layer in accordance with the first embodiment of the present invention.

FIG. 5 illustrates a structure of the electromagnetic wave filter layer in accordance with the first embodiment of the present invention.

As shown in FIG. 5, the electromagnetic wave shield layer 300 in accordance with the first embodiment of the present invention includes: a mesh part 320 having conductive meshes 330 in a grid structure; and a metal frame 310 formed to surround an outer edge of the mesh part 320.

The method for fabricating the electromagnetic wave shield layer in accordance with the first embodiment of the present invention will now be described with reference to FIG. 6.

Figure 6:
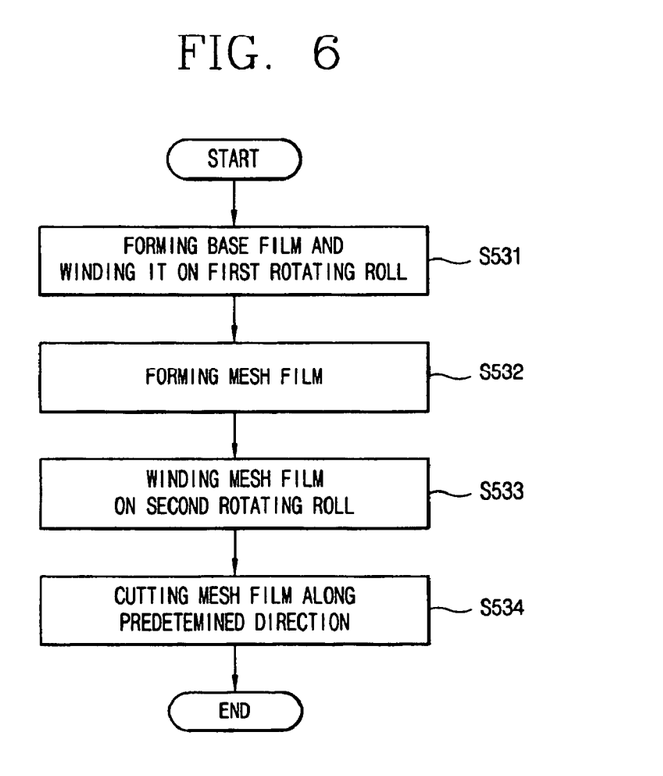
FIG. 6 is a flow chart of a method for fabricating the electromagnetic wave shield layer in accordance with the first embodiment of the present invention.

FIG. 6 is a flow chart of a method for fabricating the electromagnetic wave shield layer in accordance with the first embodiment of the present invention.

As shown in FIG. 6, the method for fabricating the electromagnetic wave shield layer in accordance with the present invention includes: forming a base film and winding it on a first rotating roll (step S531); depositing a mesh metal on the base film flattened by rotating the first rotating roll and patterning the deposited mesh metal to form a mesh film (step S532); winding the mesh film on a second rotating roll (step S533); and cutting the base film wound on the second rotating roll along a predetermined direction (step S534).

The method for fabricating the electromagnetic wave shield layer in accordance with the first embodiment of the present invention will now be described in detail.

First, after the base film 340 is formed, it is wound on the first rotating roll (step S531). The base film 340 has a double-layer structure including a PET (Polyethylene Terephthalate) and a metal thin layer formed through a laminating process at an upper surface of the PET.

The mesh metal is deposited on the base film 340 flattened by rotating the first rotating roll. Preferably, the mesh metal has relatively good conductivity such as Ag or Cu. By patterning the mesh metal deposited on the base film 340 through exposing and developing processes with a photomask, the mesh film is formed (step S532).

Thereafter, the mesh film is wound on the second rotating roll (step S533) and then cut to a predetermined size (step S534). At this time, since the bias angle is controlled as the cut direction of the mesh film is controlled according to resolution of the PDP, the mesh part 320 corresponding to various resolution of the PDP can be formed without changing the photomask.

Accordingly, as the metal frame 310 is formed surrounding an outer edge of the mesh part 320, the electromagnetic wave shield layer 300 is formed. Since the formed mesh part 320 is grounded to ground power, it absorbs electromagnetic wave discharged from the PDP and discharges it, thereby shielding discharge of electromagnetic wave.

Next, the near infrared shield layer 400 for shielding discharge of near infrared ray by absorbing near infrared ray in the wavelength band of about 800~1000 nm generated from the PDP is attached at the lower surface of the electromagnetic wave shield layer 300. Thus, controlling infrared ray (about 947 nm) generated from a remote controller or the like can be normally inputted to an infrared receiving unit prepared in the PDP set without being interference by the infrared ray (step S54).

As color is controlled through a color dye at the lower surface of the near infrared shield layer 400, the color compensation layer 500 for enhancing color purity of the PDP is attached (step S55).

The second anti-reflection layer 600 for preventing reflection of light made incident from outside is attached at the lower surface of the color compensation layer 500 (step S56).

The first anti-reflection layer 200, the electromagnetic wave shield layer 300, the near infrared shield layer 400, the color compensation layer 500 and the second anti-reflection layer 600 are sequentially attached at the upper surface of the lower surface of the glass substrate with a pressure sensitive adhesive or an adhesive.

The thusly formed optical filter is installed at the entire surface of the PDP and performs functions of shielding electromagnetic wave, preventing reflection of external light, shielding near infrared ray and compensating color.

An optical filter of a PDP employing the electromagnetic wave shield layer in accordance with a second embodiment of the present invention will now be described with reference to FIG. 7.

The optical filter in accordance with the second embodiment of the present invention is capable of relatively reducing thickness and weight of the PDP set by directly attaching a mesh part at the entire surface of the PDP, rather than using the glass substrate constituting the optical filter of the PDP in accordance with the first embodiment of the present invention.

Figure 7:
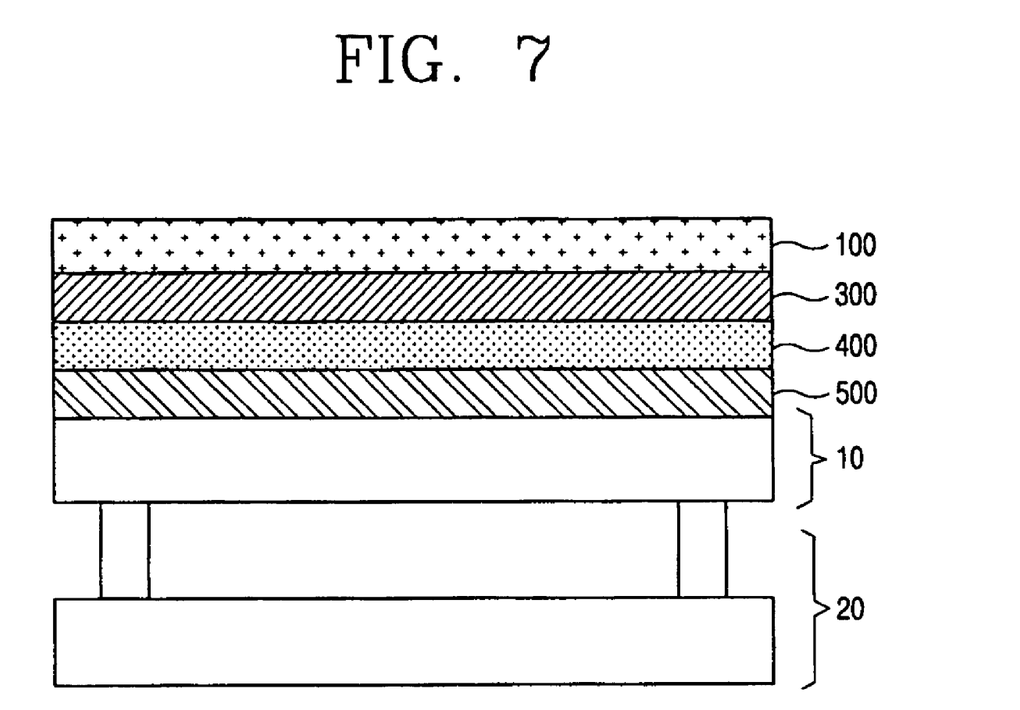
FIG. 7 is a sectional view showing a structure of an optical filter of a PDP employing an electromagnetic wave shield layer in accordance with a second embodiment of the present invention.

FIG. 7 is a sectional view showing a structure of an optical filter of a PDP employing an electromagnetic wave shield layer in accordance with a second embodiment of the present invention.

As shown in FIG. 7, the optical filter of a PDP employing the electromagnetic wave shield layer in accordance with a second embodiment of the present invention includes: a color compensation layer 500, a near infrared shield layer 400, an electromagnetic wave shield layer 300 and an anti-reflection layer 100 sequentially formed on the PDP.

Except for the electromagnetic wave shield layer 300, the color compensation layer 500, the near infrared shield layer 400, and the anti-reflection layer 100 are constructed and operated in the same manner as in the first embodiment of the present invention, so descriptions of which are omitted.

The electromagnetic wave shield layer 300 in accordance with the second embodiment of the present invention will now be described with reference to FIG. 8.

Figure 8:
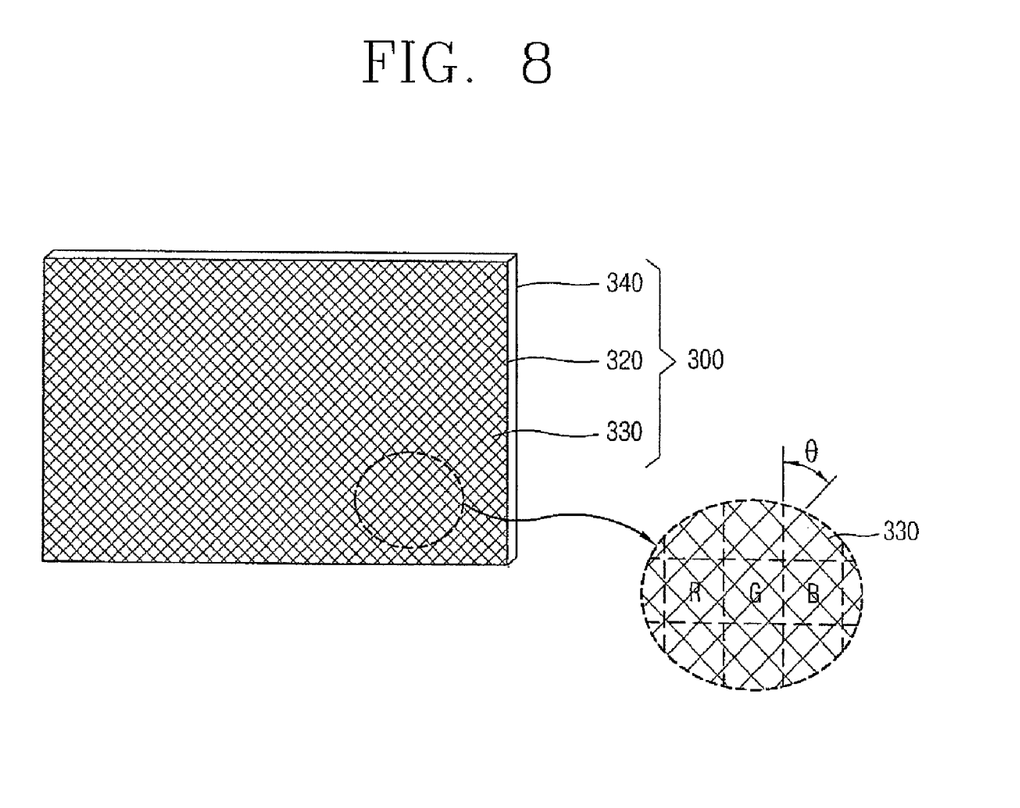
FIG. 8 illustrates a structure of the electromagnetic wave filter layer in accordance with the second embodiment of the present invention.

FIG. 8 illustrates a structure of the electromagnetic wave filter layer in accordance with the second embodiment of the present invention.

As shown in FIG. 8, the electromagnetic wave shield layer 300 in accordance with the second embodiment of the present invention includes a mesh part 320 having conductive meshes 300 in a grid structure.

The optical filter of a PDP employing the electromagnetic wave shield layer in accordance with the second embodiment of the present invention includes the mesh part 320 directly attached at the upper surface of the PDP without such a metal frame 310 as in the first embodiment and does not use such a glass substrate 200 as in the first embodiment. Thus, the thickness and weight of the PDP in accordance with the second embodiment of the present invention can be reduce compared to the PDP adopting the optical filter as in the first embodiment of the present invention.

As so far described, the optical filter of the PDP and its fabrication method in accordance with the present invention have the following advantage.

That is, for example, by controlling the cut direction of the mesh film constituting the conductive meshes according to the resolution of the PDP, the electromagnetic wave shield layer having a predetermined bias angle according to various resolution of the PDP can be formed with the same photomask.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. An optical filter of a plasma display panel (PDP) comprising:
    an electromagnetic wave shielding layer formed in a mesh on a base film;
    an anti-reflection layer attached on an upper surface of the electromagnetic wave shielding layer; and
    a near infrared ray shielding layer attached on a lower surface of the electromagnetic wave shielding layer, wherein a size of the base film is at least substantially equal to a size of the electromagnetic wave shielding layer, wherein the mesh includes mesh lines in an inner grid that are tilted at an angle determined based on a cut direction of the mesh, and wherein the inner grid is arranged so that the mesh lines have a same predetermined number (N) of intersections overlapping each of a plurality of pixels or sub-pixels of the panel, where N>1.

2. The optical filter of claim 1, wherein the mesh has a uniform grid structure.

3. The optical filter of claim 1, wherein the mesh lines are tilted at the angle based on a width of one or more barrier ribs or a gap between the barrier ribs of the PDP, and wherein an area that includes a gap between barrier ribs and widths of the barrier ribs in each of the pixels or sub-pixels includes the same predetermined number of intersections of the mesh lines.

4. The optical filter of claim 1, wherein the cut direction is based on a pixel resolution of the PDP.

5. The optical filter of claim 1, wherein the mesh lines in the inner grid are tilted at the angle relative to one or more horizontal or vertical barrier ribs of the PDP.

6. An optical filter of a plasma display panel (PDP) comprising:
   an electromagnetic wave shielding layer formed in a mesh on a base film;
   an anti-reflection layer attached on an upper surface of the electromagnetic wave shielding layer; and
   a near infrared ray shielding layer attached on a lower surface of the electromagnetic wave shielding layer; wherein the electromagnetic wave shielding layer is formed in the mesh on substantially an entire surface of the base film, wherein the mesh includes mesh lines in an inner grid that are tiled at an angle determined based on a cut direction of the mesh, and wherein the inner grid is arranged so that the mesh lines have a same predetermined number (N) of intersections overlapping each of a plurality of pixels or sub-pixels of the panel, where N>1.

7. An optical filter of a plasma display panel (PDP) comprising:
   an electromagnetic wave shielding layer formed in a mesh on a base film;
   an anti-reflection layer attached on an upper surface of the electromagnetic wave shielding layer; and
   a near infrared ray shielding layer attached on a lower surface of the electromagnetic wave shielding layer, wherein an entire region of one surface of the electromagnetic wave shielding layer is formed only on substantially an entire surface of the base film, wherein the mesh includes mesh lines in an inner grid that are tilted at an angle determined based on a cut direction of the mesh, and wherein the inner grid is arranged so that the mesh lines have a same predetermined number (N) of intersections overlapping each of a plurality of pixels or sub-pixels of the panel, wherein N>1.

8. The optical filter of claim 7, wherein the electromagnetic wave shielding layer does not have a metal frame region.

9. A method for fabricating an optical filter of a plasma display panel (PDP) comprising:
   forming an electromagnetic wave shielding layer formed in a mesh on a base film;
   attaching an anti-reflection layer on an upper surface of the electromagnetic wave shielding layer; and
   attaching a near infrared ray shielding layer on a lower surface of the electromagnetic wave shielding layer, wherein, in forming the electromagnetic wave shielding layer, a size of the base film is at least substantially equal to a size of the electromagnetic wave shielding layer, wherein the mesh includes mesh lines in an inner grid that are tilted at an angle determined based on a cut direction of the mesh, and wherein the inner grid is arranged so that the mesh lines have a same predetermined number (N) of intersections overlapping each of a plurality of pixels or sub-pixels of the panel, where N>1.

10. The method of claim 9, wherein the mesh has a uniform grid structure.

11. The method of claim 9, wherein the mesh lines are tilted at the angle based on a width of one or more barrier ribs or a gap between the barrier ribs of the PDP, and wherein an area that includes a gap between barrier ribs and widths of the barrier ribs in each of the pixels or sub-pixels includes the same predetermined number of intersections of the mesh lines.

12. The method of claim 9, wherein the cut direction is based on the pixels resolution of the PDP.

13. The method of claim 9, wherein the mesh lines in the inner grid are tilted at the angle relative to one or more horizontal or vertical barrier ribs of the PDP.

14. A method for fabricating an optical filter of a plasma display panel (PDP) comprising:
   forming an electromagnetic wave shielding layer formed in a mesh on a base film;
   attaching an anti-reflection layer on an upper surface of the electromagnetic wave shielding layer; and
   attaching a near infrared ray shielding layer on a lower surface of the electromagnetic wave shielding layer, wherein, in forming the electromagnetic wave shielding layer, the mesh is formed on substantially an entire surface of the base film, wherein the mesh includes mesh lines in an inner grid that are tilted at an angle determined based on a cut direction of the mesh, and wherein the inner grid is arranged so that the mesh lines have a same predetermined number (N) of intersections overlapping each of a plurality of pixels or sub-pixels of the panel, wherein N>1.

15. A method for fabricating an optical filter of a plasma display panel (PDP) comprising:
   forming an electromagnetic wave shielding layer formed in a mesh on a base film;
   attaching an anti-reflection layer on an upper surface of the electromagnetic wave shielding layer; and
   attaching a near infrared ray shielding layer on a lower surface of the electromagnetic wave shielding layer, wherein, in forming the electromagnetic wave shielding layer, an entire region of one surface of the electromagnetic wave shielding layer is formed only on substantially an entire surface of the base film, wherein the mesh includes mesh lines in an inner grid that a tilted at an angle determined based on a cut direction of the mesh, and wherein the inner grid is arranged so that the mesh lines have a same predetermined number (N) of intersections overlapping each of a plurality of pixels or sub-pixels of the panel, wherein N>1.

* * * * *